(12) United States Patent
Cheung et al.

(10) Patent No.: US 7,548,067 B2
(45) Date of Patent: Jun. 16, 2009

(54) METHODS FOR MEASURING CAPACITANCE

(75) Inventors: Kin P. Cheung, Hoboken, NJ (US); Dawei Heh, Austin, TX (US); Byoung Hun Lee, Austin, TX (US); Rino Choi, Austin, TX (US)

(73) Assignees: Sematech, Inc., Austin, TX (US); Rutgers University, New Brunswick, NJ (US)

( * ) Notice: Subject to any disclaimer, the term of this patent is extended or adjusted under 35 U.S.C. 154(b) by 412 days.

(21) Appl. No.: 11/552,779

(22) Filed: Oct. 25, 2006

(65) Prior Publication Data

US 2008/0100283 A1 May 1, 2008

(51) Int. Cl.
  *G01R 31/11* (2006.01)
  *G01R 27/04* (2006.01)
  *G01R 27/32* (2006.01)
  *G01R 31/26* (2006.01)
(52) U.S. Cl. .................. 324/533; 324/534; 324/642; 324/769
(58) Field of Classification Search .................. 324/533, 324/534, 642, 769
  See application file for complete search history.

(56) References Cited

U.S. PATENT DOCUMENTS 5,442,302 A * 8/1995 Fujimaki .................... 324/765
6,472,233 B1 10/2002 Ahmed et al. ................ 438/14
6,472,236 B1 10/2002 Wang et al. .................. 438/14
6,512,377 B1 * 1/2003 Deng et al. .................. 324/533

OTHER PUBLICATIONS

Ahmed et al., "Impact of tunnel currents and channel resistance on the characterization of channel inversion layer charge and polysilicon-gate depletion of sub-20A gate oxide MOSFET's," *IEEE Trans. Electron Dev.*, 46:1650-1655, 1999.
Aoki and Shimasue, "Leaky large area gate capacitance extraction for nanometer CMOS technology used for RF applications," *Tech. Digest, International Meeting for Future of Electron Devices*, 109-110, 2004.
Barlage et al., "Inversion MOS capacitance extraction for high-leakage dielectrics using a transmission line equivalent circuit," *IEEE Electron Dev. Lett.*, 21:454-456, 2000.
Choi et al., "MOS C-V Characterization of Ultrathin Gate Oxide Thickness (1.3-1.8 nm)," *IEEE Electron Device Letters*, 20(6):292-294, 1999.
Ghibaudo and Clerc, "Characterization and modeling issues in MOS structures with ultra thin oxides," *Proceedings, 24th International Conference on Microelectronics*, 1:103-114, 2004.

(Continued)

*Primary Examiner*—Vincent Q Nguyen
*Assistant Examiner*—Amy He
(74) *Attorney, Agent, or Firm*—Fulbright & Jaworski LLP (57) ABSTRACT

Methods for determining capacitance values of a metal on semiconductor (MOS) structure are provided. A time domain reflectometry circuit may be loaded with a MOS structure. The MOS structure may be biased with various voltages, and reflectometry waveforms from the applied voltage may be collected. The capacitance of the MOS structure may be determined from the reflectometry waveforms.

8 Claims, 6 Drawing Sheets

OTHER PUBLICATIONS

Henson et al., "Estimating oxide thickness of tunnel oxides down to 1.4 nm using conventional capacitance-voltage measurements on MOS capacitors," *IEEE Electron Dev. Lett.*, 20:179-181, 1999.

Lime et al., "Characterization of effective mobility by split C(V) technique in N-MOSFETs with ultrathin gate oxides," *Solid-State Electronics*, 47:1147, 2003.

Luo and Ma, "A new method to extract EOT of ultrathin gate dielectric with high leakage current," *IEEE Electron Dev. Lett.*, 25(9):655-657, 2004.

Nara et al., "Applicability limits of the two-frequency capacitance measurement technique for the thickness extraction of ultrathin gate oxide," *IEEE Trans. Semiconductor Manufacturing*, 15(2):209-213, 2002.

Rideau et al., "Series resistance estimation and C(V) measurements on ultra thin oxide MOS capacitors," *International Conference on Microelectronic Test Structures*, 191-196, 2003.

Schmitz et al., "RF capacitance-voltage characterization of MOSFETs with high leakage dielectrics," *IEEE Electron Dev. Lett.*, 24(1):37-39, 2003.

Teramoto et al., "Capacitance-Voltage Measurement Method for Ultrathin Gate Dielectrics Using LC Resonance Circuit," *IEEE Trans. Semiconductor Manufacturing*, 19(1):43-49, 2006.

Yaremchuk, "New interpretation of C-V measurements for determining the concentration profile in a semiconductor," *Apple Phys. A (Mat. Sci. Processing)*, A73:503, 2001.

\* cited by examiner

METHODS FOR MEASURING CAPACITANCE

BACKGROUND OF THE INVENTION

1. Field of the Invention

The present invention relates generally to characterizing metal-oxide-semiconductor structures, and more particularly, to a method for measuring capacitance.

2. Description of Related Art

Capacitance-voltage (CV) measurement is generally used to characterize metal-oxide-semiconductor (MOS) structure of a MOS field-effect-transistor (MOSFET). In particular, a number of critical parameters from the CV measurements are extracted, such as channel length, mobility, interface traps, substrate doping profile, and oxide thickness.

As the manufacturing processes are improved, the device sizes of the MOSFETS are decreasing and the gate insulation or gate oxide is becoming thinner. The thinner insulator of the MOS structure results in a combination of high leakage current and low capacitor impedance. Therefore, the gate capacitance is becoming more difficult to determine.

For example, current capacitance-voltage test systems may be used to obtain CV measurements from a device. These systems use a AC voltage source and a DC biasing voltage source that are added to form a stimulus that is applied through stimulus terminals coupled to substrate region of the device. A sense terminal is coupled to a gate to provide a return path for the currents generated by the stimulus voltages. Using a current meter, the AC current amplitude and phase are measured to determine the capacitance of the test structure. The capacitance at each biasing level is recorded to form a CV curve.

However, the capacitance measurements using the current method and system, especially for thin gate oxides are distorted by the dominance of the large gate leakage current. To minimize this effect, the test structure is made smaller (e.g., less than 100 micrometer$^2$). This causes a further inaccuracy in the measurement of the gate capacitance since the parasitic capacitances now begin to dominate.

The referenced shortcomings are not intended to be exhaustive, but rather are among many that tend to impair the effectiveness of previously known techniques concerning measuring capacitance values; however, those mentioned here are sufficient to demonstrate that the methodologies appearing in the art have not been satisfactory and that a significant need exists for the techniques described and claimed in this disclosure.

SUMMARY OF THE INVENTION

Current systems and methods for accurate capacitance-voltage (CV) measurement of MOS capacitor with very high leakage current is a problem that does not yet has a satisfactory solution. Elaborated methods can improve the accuracy, but increase measurement complexity at the same time. The present disclosure provides for measuring CV under high leakage condition based on Time-Domain-Reflectometry (TDR).

In one respect, the present disclosure applies an existing technology, time domain reflectometry (TDR) for a different purpose, and in particular, TDR is used for capacitance-voltage measurements. In one respect, different DC bias voltages may be applied to a device under test (DUT) and a corresponding capacitance value at each DC bias point may be measured.

Aside from a DC bias, an AC signal (e.g., stepped input voltage) may be used to calculate the capacitance value at each DC bias. The DC bias may change vary and the step of applying an AC may be used to determine various C-V measurements. In order to determine a capacitance, a comparison step comparing a reference reflectivity curve (e.g., without loading a DUT or an open circuit) and a measured reflectivity curve with a DUT may be used.

In one respect, a method for measuring a capacitance value of a metal-oxide-semiconductor (MOS) structure is disclosed. The method may include determining a reference reflectivity waveform. In some embodiments, the step of determining a reference reflectivity waveform includes biasing a MOS structure at about zero voltages.

The method may also include steps of biasing the MOS structure with a second voltage (e.g., an input stepped voltage) and determining a reflectivity waveform of the biased MOS structure. The capacitance value of the MOS structure may be determined as a function of the reflectivity waveforms, and more particularly, the reference reflectivity waveform and the reflectivity waveform of the biased MOS structure.

In other respects, the present disclosure provides a method for determining a capacitance value of a MOS structure, which includes the steps of biasing the MOS structure with a first voltage (e.g., at about zero volts) and a second voltage (a DC bias voltage). A reflectivity waveform corresponding to the biased MOS at a first voltage and a reflectivity waveform corresponding to the biased MOS at a second voltage may be determined. The capacitance value of the MOS structure may be determined as a function of the reflectivity waveform of the biased MOS at a first voltage and a reflectivity waveform corresponding to the biased MOS at a second voltage.

In some respects, a method for determining a capacitance value of a MOS structure is provided. The method may include a step for applying a first voltage to a time domain reflectometry (TDR) circuit and determining a reflectivity waveform as a function of the first voltage. Next, a MOS structure may be coupled to the TDR circuit. The MOS structure may be biased at a DC voltage.

Next, a second voltage may be applied to the TDR circuit and a reflectivity waveform may be determined as a function of the second voltage and the DC voltage. The capacitance value of the MOS structure may be determined as a function of the reflectivity waveform of the biased MOS at a first voltage and a reflectivity waveform corresponding to the second and DC voltages The term "coupled" is defined as connected, although no t necessarily directly, and not necessarily mechanically.

The terms "a" and "an" are defined as one or more unless this disclosure explicitly requires otherwise.

The term "substantially," "about," and its variations are defined as being largely but not necessarily wholly what is specified as understood by one of ordinary skill in the art, and in one non-limiting embodiment, the substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

The invention and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present disclosure provides methods for CV measurement by determining the change of a stored charge in a capacitor as a result of a known voltage change. In one respect, the method for CV measurement relies on a RF capacitor structure and time domain reflectometry (TDR) to extract the capacitance. TDR is a well established measurement technique and commercial equipment is readily available such as a Tektronix Model CSA8000 scope with TDR plug-in. In TDR, a step function with a relatively fast rise time is outputted from a scope to a device under test (DUT) (e.g., a capacitor, a MOS structure, etc.) through, for example, a bias-TEE (for DC bias) and a transmission line. Due to impedance mismatch between the transmission line and the capacitor, the step function is reflected back toward the scope which records it.

Figure 1:
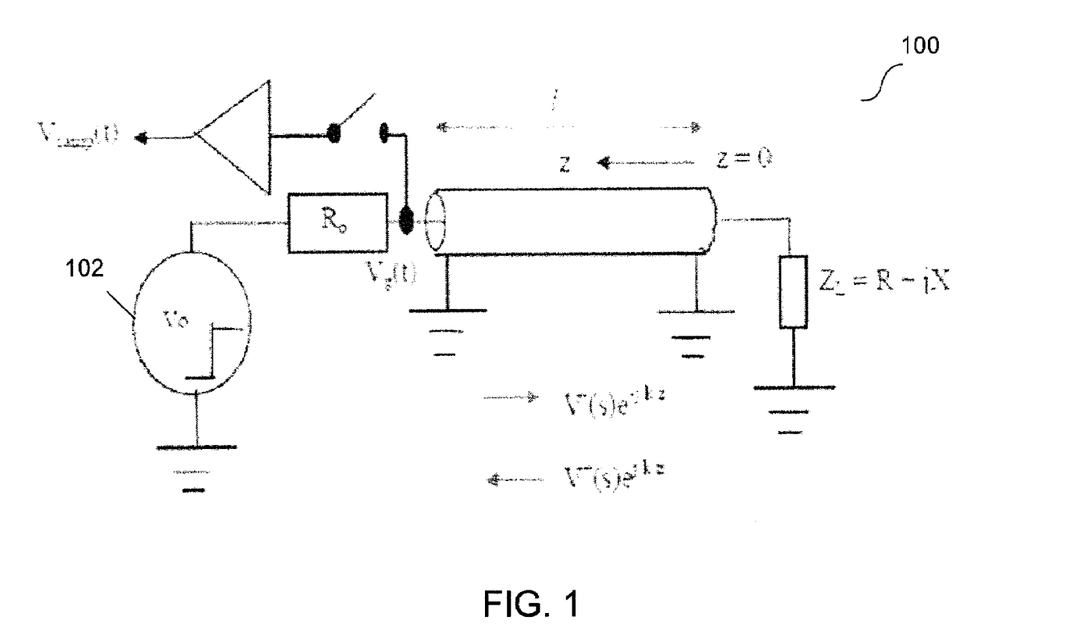
FIG. 1 is a schematic for a time domain reflectometry circuit, in accordance with embodiments of this disclosure.

Referring to FIG. 1, a TDR circuit setup, according to embodiments of this disclosure is shown. A stepped input voltage 102 may be applied at an input end (z=1). This voltage signal may propagate through a transmission line and may be reflected by a load at a distal end of the transmission line (z=0). The wave form of the reflected signal may be strongly affected by electrical characteristics of the load impedance. Therefore, by measuring the reflected signal, the electrical characteristics of the load impedance may be accurately analyzed.

Figure 2A:
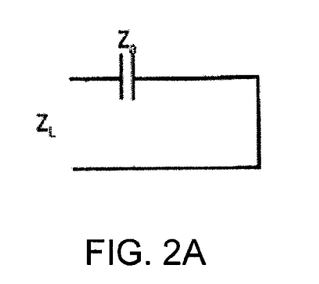
FIG. 2A is a schematic of an equivalent circuit of MOS structure biased at about zero, in accordance with embodiments of this disclosure.
Figure 2B:
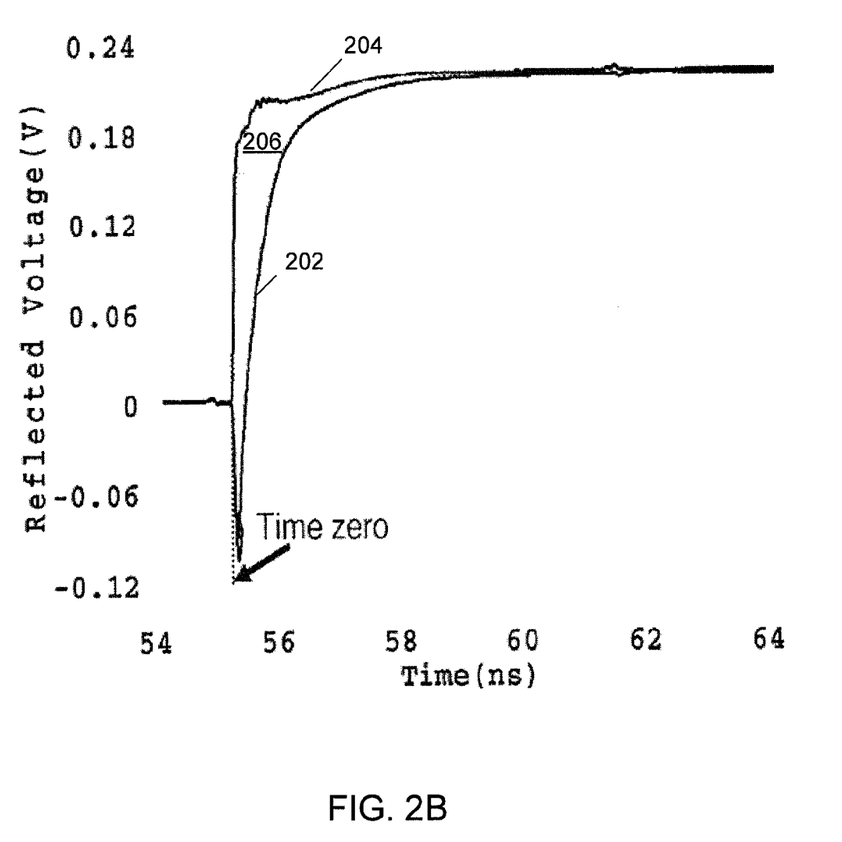
FIG. 2B is a graph of a reflective waveform from an ideal capacitor in a time domain reflectometry circuit, in accordance with embodiments of this disclosure.

When TDR circuit shown 100 in FIG. 1 is open at the load end, i.e., the load impedance is infinity and the input stepped signal may be substantially reflected. To determine the capacitance of the MOS structure, the device may be biased at about zero DC volts, where the leakage current is negligible. In one respect, the MOS structure biased at about zero DC volts may be modeled by an ideal capacitor as shown in FIG. 2A. An example reflected waveform is shown in FIG. 2B in waveform 202 from a Z3 capacitor with a titanium nitride gate and 2.0 nm of silicon dioxide.

Next, the MOS structure may be modeled with a bias. In one respect, when the MOS structure is coupled to the load end of TDR circuit 100, the capacitor may be charged by the input stepped voltage and a reflected waveform (waveform 204) may be recorded by a scope, as shown in FIG. 2B. The amount of charge used to charge the capacitor may be proportional to shaded area 206 between bias curve 202 and zero biased curve 204. The capacitance may subsequently be determined using the following equation:

$$C = \frac{1}{2Z_0 V_{step}} \int_0^\infty (V_{open}(t) - V_{DUT}(t)) dt \qquad \text{Eq. 1}$$

where $V_{Open}(t)$ is the open circuit waveform; $V_{DUT}(t)$ is the waveform from the DUT (the MOS structure biased at about zero volt) and $V_{Step}$ is the height of the step function, and $Z_0$ is the impedance of the transmission line, e.g., 50 Ohm. The integral of Eq. 1 may represent the enclosed area of the two waveforms, where the capacitance of the MOS structure may determined.

Figure 3A:
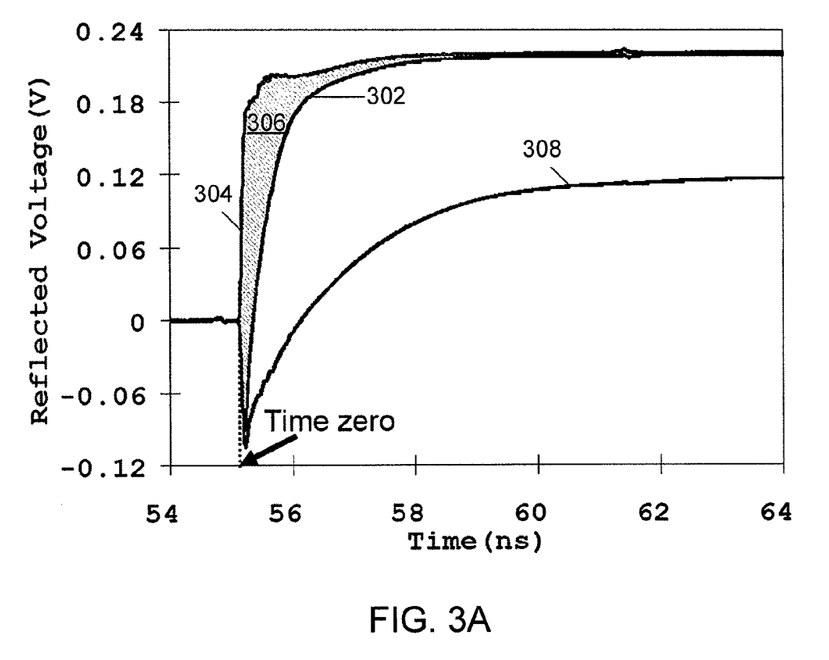
FIG. 3A is a graph of a reflective waveform from an open circuit in a time domain reflectometry circuit, in accordance with embodiments of this disclosure.

Referring to FIG. 3A, a graph of reflected waveforms of a MOS structure (a Z3 capacitor with a titanium nitride gate and 2.0 nm of silicon dioxide) load coupled to TDR circuit 100. The MOS structure may include a MOS capacitor in depletion ($V_g$=0) and in accumulation ($V_g$=−1.2) is shown. The depletion capacitance may be smaller than the accumulation capacitance, and therefore, may result in a shorter charging time.

Figure 3B:
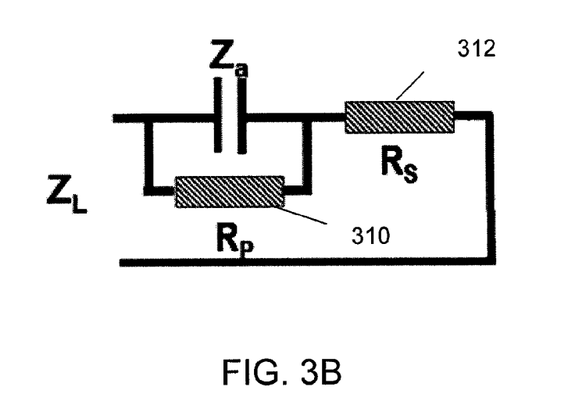
FIG. 3B is a schematic of an equivalent circuit of MOS structure biased at about zero, in accordance with embodiments of this disclosure.

For the MOS structure under zero-volt bias, the equivalent circuit is shown in FIG. 3B. In particular, the equivalent circuit may include parallel resistor 310 ($R_p$) coupled to a series resistor 312 ($R_s$). The impedance of capacitor 314 ($Z_a$) coupled to the parallel and series resistor is a short circuit when the step function first arrives. As the capacitor charges up, it eventually becomes an open circuit. For the depletion case ($V_g$=0V), leakage current is negligible and parallel resistor 310 ($R_p$) may be removed from the equivalent circuit.

Since the capacitance is smaller (compared to the accumulation case) the charging time is also shorter. At the end of charging, the signal reaches the same level as open circuit.

For the equivalent circuit shown in FIG. 3B, the series resistance $R_s$ does not appear in Eq. 1. This can be understood by realizing that while the $R_s$ slows down the charging process, the capacitor will still be fully charged. As shaded area 306 between waveforms 302 and 304 is evaluated, all stored charges are accounted for. For the MOS capacitor at accumulation ($V_g$=-1.2V in FIG. 3A), very high level of tunneling current may exist when the oxide is extremely thin. In this case, the impedance $Z_L$ when the capacitor is fully charge is equal to $$R_P + R_S = R_o.\qquad \text{Eq. 2}$$

Since $R_0$ is not very large, the reflection coefficient is much less than 1 and the reflected waveform 308 may never reach the open circuit level. The capacitance of the MOS structure (e.g., shaded area 306) may be determined by the following equation:

$$C = \frac{1}{2Z_0 V_{step}} M \int_0^\infty \left[\left(\frac{R_0 - Z_0}{R_0 + Z_0}\right) V_{opem}(t) - V_{DUT}(t)\right] dt \qquad \text{Eq. 3A}$$

where $$M \text{ is } \frac{(R_0 + Z_0)^2}{R_p^2}.$$

Applying Eq. 2 to Eq. 3A, the capacitance may also be determined as follows:

$$C = \frac{1}{2Z_0 V_{step}} \frac{(R_P + R_s + Z_0)^2}{R_p^2} \qquad \text{Eq. 3B}$$
$$\int_0^\infty \left[\left(\frac{R_P + R_s + Z_0}{R_P + R_s + Z_0}\right) V_{opem}(t) - V_{DUT}(t)\right] dt.$$

Figure 4:
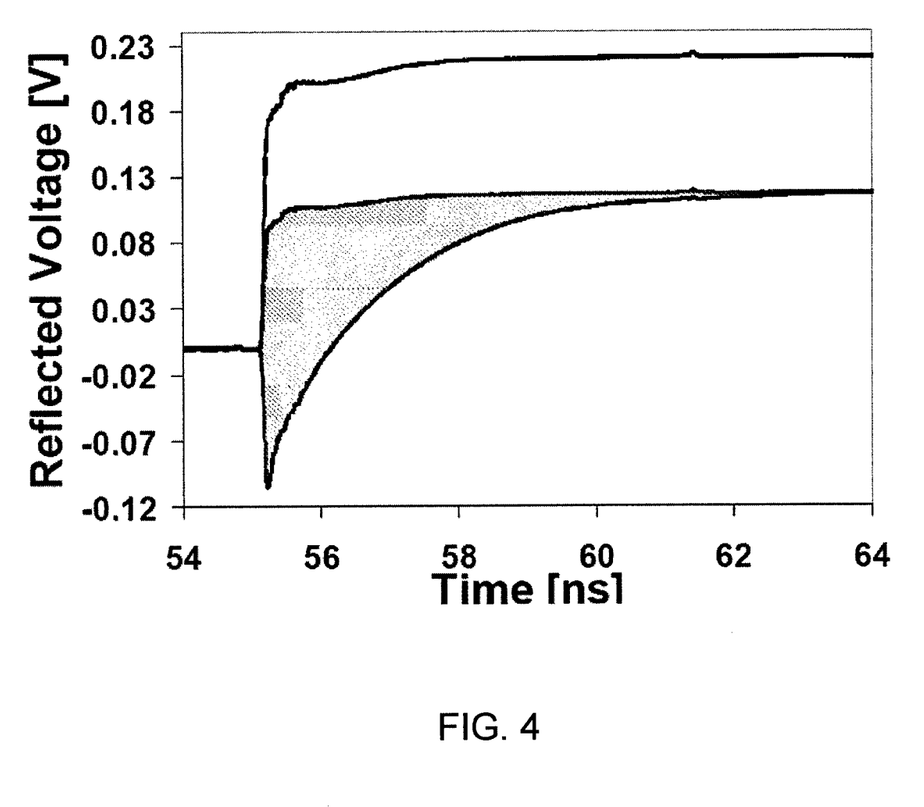
FIG. 4 is a graph comparing of a normalized reflectance waveform, in accordance with embodiments of this disclosure.

Eqs. 3A and 3B suggest that the final level of the open circuit waveform may be normalized to the final level of the reflected waveform from the capacitor and then integrated to determine the capacitance of shaded area 306. In other words, the capacitance of the MOS structure may be proportional to the area enclosed by a normalized open circuit reflective waveform. Referring to FIG. 4, a graph illustrating a normalized open circuit waveform and the resulting shaded area representing the total capacitance is shown. The shaded area is obviously smaller than that of a leak-free capacitor because a leak-free capacitor would not need to bring down the open circuit waveform through the normalization process. A pre-integral factor M may rescale the shaded area back to the actual area would have been if there were zero leakage current.

At any instant in time, the reflection coefficient is determined by the impedance mismatch by the following equation:

$$\rho = \frac{Z_L - Z_0}{Z_L + Z_0}, \qquad \text{Eq. 4}$$

where $Z_0$ is the impedance of the transmission line, e.g., 50 Ohm, and $Z_L$ is the impedance of the DUT. For an open circuit, $Z_L$ is infinity and the reflection coefficient is 1.

From the final voltage level of the reflected waveform, Eq. 4 may be used to calculate the value of $R_0$. Alternatively, $R_0$ may be obtained by a DC leakage measurement. To find $R_P$, $R_s$ may need to be determined. To determine $R_s$, at time zero the capacitor is a short circuit, and thus, the impedance at this point is simply $R_s$. In an ideal case with a perfect step function, the reflection coefficient at time zero may be used to find $R_s$ directly. In real situation, if the capacitor charging time is long compared to the step function rise time, the reflection coefficient at the point the capacitor charging overtakes the step function rise time may be used to extract $R_s$. For higher accuracy or when the capacitor charging time is short, extraction of $R_s$ may be done by using the known shape of the step function (open circuit waveform) and the measured charging rise time. This more accurate method was used in the CV result described below.

When $R_p >> R_s$, the pre-integral variable, M, may be approximated as $$\frac{(R_0 + Z_0)^2}{R_0^2}.$$

Figure 5:
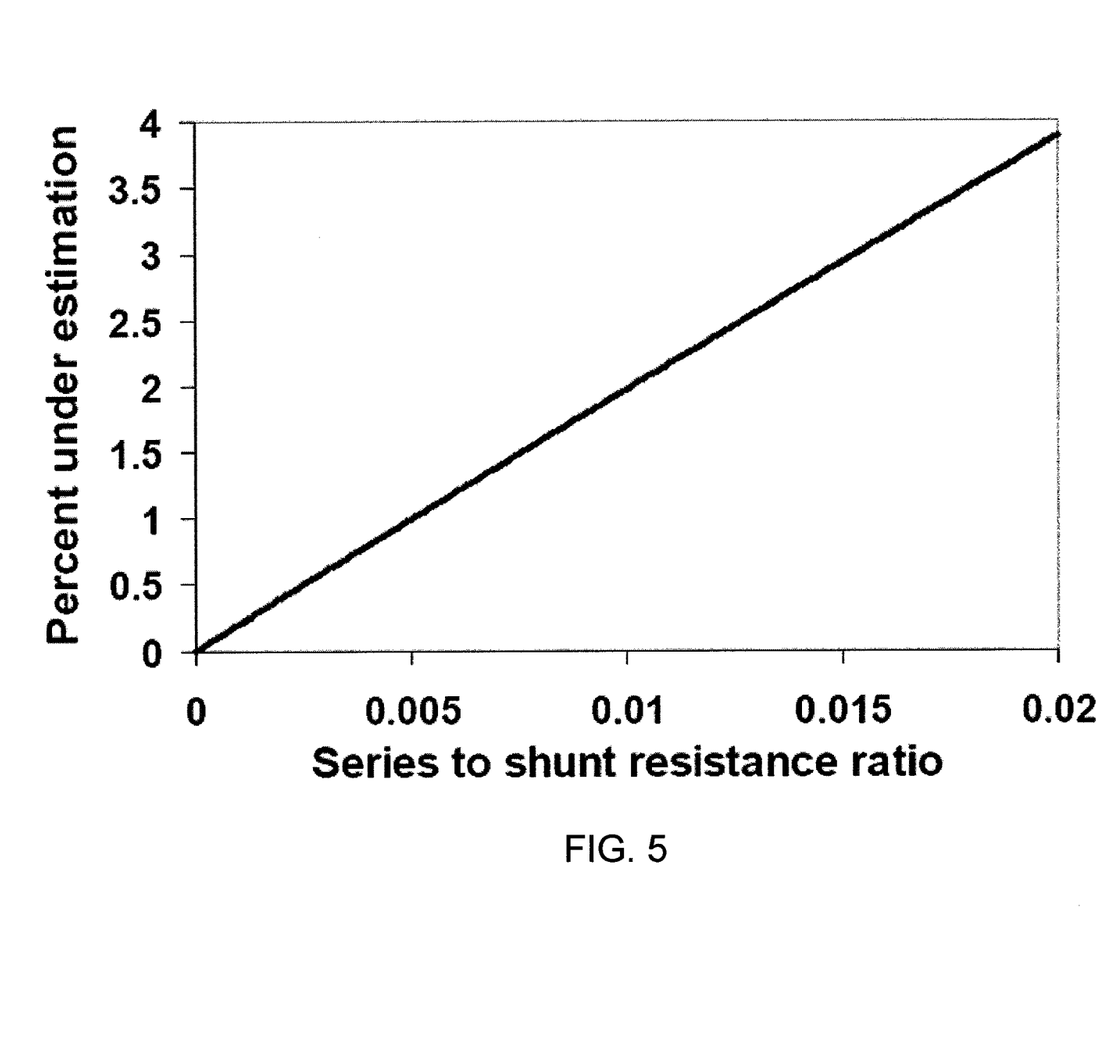
FIG. 5 is a graph of a percent underestimation of a capacitance, in accordance with embodiments of this disclosure.

By doing so, $R_s$ may not need to be extracted and the TDR method of the present disclosure becomes extremely simple. The resulting capacitance is an under estimation of the real value. FIG. 5 shows the percent error as a function of $R_s$ to $R_p$ ratio. Typical $R_s$ values are in the tens of Ohms. $R_p$ needs to be at least 200 times larger for 1% accuracy. The approximation may be satisfied for most capacitors except for those with extremely high leakage.

FIG. 5 also serves to indicate how accurate $R_s$ needs to be measured. If $R_s$ is replaced with $\Delta R_s$ in the ratio (horizontal axis), the result is basically unchanged. Thus, 1% accuracy may be achieved then the $\Delta R_s$ to $R_p$ ratio need to be less than about 0.005. Since $R_s$ is typically much smaller than $R_p$ to begin with, even a rough estimate of $R_s$ is enough to achieve high accuracy using Eqs. 3A or 3B.

Figure 6:
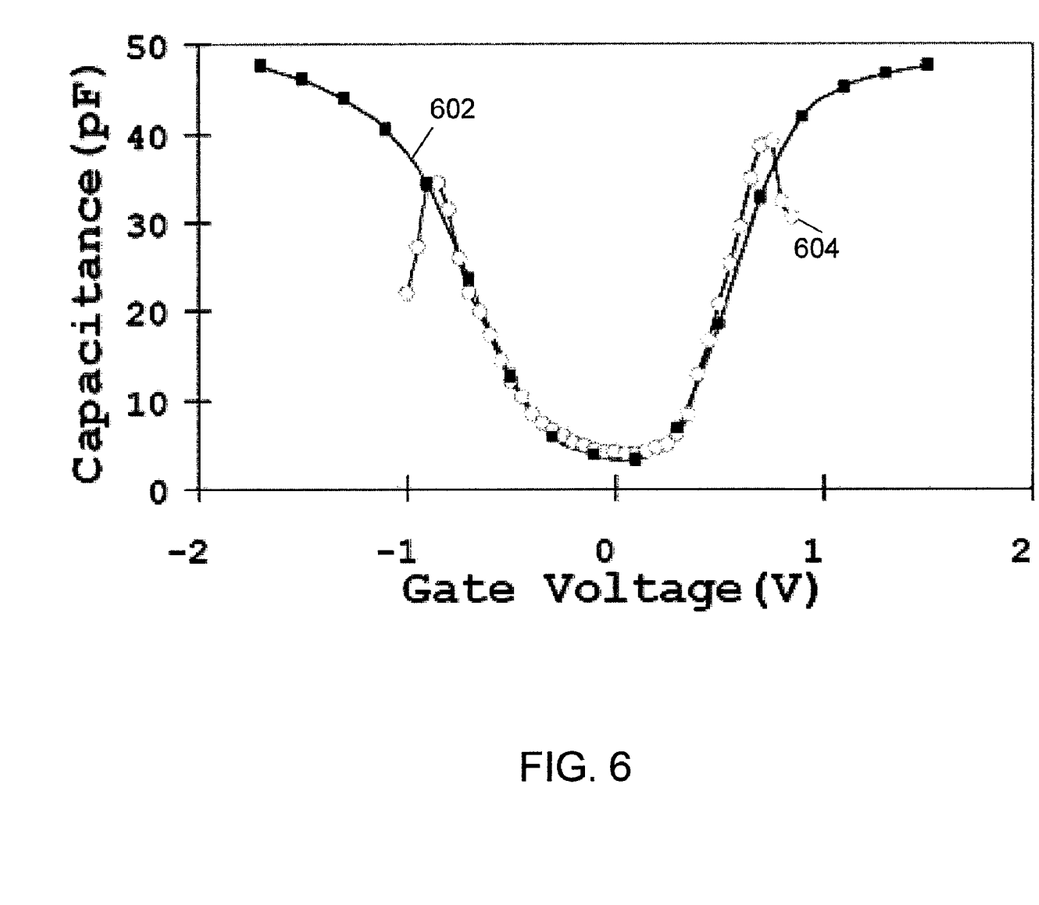
FIG. 6 is a graph of capacitance-voltage measurements, in accordance with embodiments of this disclosure.

Referring to FIG. 6, CV curve 602 extracted using the TDR method on a MOS capacitor with equivalent oxide thickness (EOT) of 1.2 nanometers is shown. Superimposed in the graph shown in FIG. 6 is CV curve 604 measured using a lock-in amplifier at 1 kHz. The capacitor is constructed like a transistor but with source, drain and substrate all tied together to provide the charge needed at inversion. Clearly, the two methods agree well in region where the leakage current is not very high. In regions with high leakage current, the TDR method of the present disclosure produces the expected CV curve while the lock-in method does not.

In summary, we introduced a new high-accuracy method to measure CV on highly leaky MOS capacitors. This is a new application of a well established measurement technique, namely Time-Domain-Reflectometry (TDR). The TDR method requires capacitors. that are designed for RF measurement.

All of the methods disclosed and claimed herein can be executed without undue experimentation in light of the present disclosure. While the methods of this disclosure may have been described in terms of preferred embodiments, it will be apparent to those of ordinary skill in the art that variations may be applied to the methods and in the steps or in the sequence of steps of the method described herein without departing from the concept, spirit and scope of the disclosure. All such similar substitutes and modifications apparent to those skilled in the art are deemed to be within the spirit, scope, and concept of the disclosure as defined by the appended claims.

The invention claimed is:

1. A method for measuring capacitance value of a metal-oxide-semiconductor (MOS) structure, comprising:
   determining a reference waveform;
   biasing a MOS structure with a DC voltage;
   determining a reflectivity waveform of the biased MOS structure; and
   determining a capacitance value of the MOS structure as a function of the reference reflectivity waveform and the reflectivity waveform of the biased MOS structure.

2. The method of claim 1, the step of determining a reference reflectivity waveform comprising biasing the MOS structure with about zero voltage.

3. A method for measuring capacitance value of a metal-oxide-semiconductor (MOS) structure, comprising:
   biasing the MOS structure with a first voltage;
   biasing the MOS structure with a second voltage;
   determining a reflectivity waveform for the biased MOS structure with the first voltage and a reflectivity waveform from the biased MOS structure with the second voltage; and
   determining a capacitance value of the MOS structure as a function of the reflectivity waveform for the biased MOS structure with the first voltage and the reflectivity waveform from the biased MOS structure with the second voltage.

4. The method of claim 3, the step of biasing the MOS structure with a first voltage comprises biasing the MOS structure with about zero volts.

5. The method of claim 3, the step of biasing the MOS structure with a second voltage comprises biasing the MOS structure with a DC voltage.

6. A method for measuring capacitance value of a metal-oxide-semiconductor (MOS) structure, comprising:
   applying a first voltage to a time domain reflectometry circuit;
   determining a reflectivity waveform as a function of the first voltage;
   coupling a MOS structure to the time domain reflectometry circuit;
   biasing the MOS structure with a DC voltage;
   applying a second voltage to the time domain reflectometry circuit;
   determining a reflectivity waveform as a function of the second and DC voltages; and
   determining a capacitance value of the MOS structure as a function of the reflectivity waveform of the first voltage and the reflectivity waveform of the second and DC voltages.

7. The method of claim 6, the step of applying a second voltage comprises applying an input stepped voltage to the time domain reflectometry circuit.

8. The method of claim 6, the step of determining a capacitance value comprises determining a change in a capacitance value between the application of the first voltage and the second voltage.

* * * * *